United States Patent [19]

Walters, Jr.

[11] Patent Number: 5,041,738
[45] Date of Patent: Aug. 20, 1991

[54] CMOS CLOCK GENERATOR HAVING AN ADJUSTABLE OVERLAP VOLTAGE

[75] Inventor: Donald M. Walters, Jr., Austin, Tex.

[73] Assignee: Advanced Micro Devices, Inc., Sunnyvale, Calif.

[21] Appl. No.: 445,245

[22] Filed: Dec. 4, 1989

[51] Int. Cl.⁵ .................. H03K 5/13; H03K 19/094; H01H 37/36

[52] U.S. Cl. ........................ 307/269; 307/279; 307/451; 307/601; 307/605; 307/202.1

[58] Field of Search ............... 307/269, 272.1, 451, 307/585, 605, 265, 202.1, 279, 601, 262; 328/72, 63

[56] References Cited

U.S. PATENT DOCUMENTS

| | | | |
|---|---|---|---|
| 4,277,699 | 7/1981 | Brown et al. | 307/272.1 |
| 4,757,217 | 7/1988 | Sawada et al. | 307/272.1 |
| 4,855,617 | 8/1989 | Ovens | 307/272.2 |

Primary Examiner—Stanley D. Miller
Assistant Examiner—Trong Phan
Attorney, Agent, or Firm—Davis Chin

[57] ABSTRACT

A CMOS clock generator for generating internal CMOS phase clock signals having an adjustable overlap voltage includes a first circuit (18) having a first input responsive to an input clock signal for generating a first phase clock signal (01) on its output and a second circuit (22) having a first input responsive to the input clock signal for generating a second clock signal (02) on its output. The overlap voltage between the phase clock signals are adjustable either up or down to speed up or slow down a semiconductor chip after fabrication. This is achieved by the utilization of a laser to break or open up fuses connected to electrodes of transistor devices.

4 Claims, 3 Drawing Sheets 5,041,738

CMOS CLOCK GENERATOR HAVING AN ADJUSTABLE OVERLAP VOLTAGE

BACKGROUND OF THE INVENTION

This invention relates generally to timing or clocking circuitry for use with integrated circuits and more particularly, it relates to a CMOS clock generator for generating internal CMOS phase clock signals having an adjustable overlap voltage.

With the advent of large scale integration (LSI) technology, more and more circuit components are being fabricated onto a single chip of a monolithic integrated circuit so as to yield a higher integration density. Such increased circuit density has resulted in the advantages of reduced assembly cost, higher speed of operation, and low power dissipation. These advantages have motivated logic circuit designers to desire increased number of logic gates to be formed by this LSI technology. When the logic gates are used in the timing and control of the different signals in the operation of digital equipment such as a microprocessor, such logic circuits also require their own clock generator for generating internal phase clock signals for their own use.

Therefore, there has arisen the need of manufacturing a clock generator on the same single semiconductor chip in which the logic gates have a very high density. As the density of the logic gates on the semiconductor chip increases, it becomes a significantly more difficult task to produce perfect semiconductor logic chips. In an effort to improve production yields and logic chip reliability, it is necessary to check the semiconductor logic chips after fabrication to determine whether they operate properly. If the defect is due to the clock generator located on the semiconductor logic chip, it would be desirable to adjust the overlap voltage between the internal phase clock signals in an attempt to repair the defective logic chips.

It would therefore be desirable to provide a CMOS clock generator used with integrated logic circuits for generating internal CMOS phase clock signals in which the overlap voltage is adjustable. The CMOS clock generator of the present invention includes means for adjusting the clock overlap voltage either up or down to speed up or slow down a chip after fabrication. This technique utilizes a laser to break or open up fuses connected to electrodes of transistor devices.

SUMMARY OF THE INVENTION

Accordingly, it is a general object of the present invention to provide an improved CMOS clock generator for generating internal CMOS phase clock signals which is relatively simple and economical to manufacture and assemble.

It is an object of the present invention to provide a CMOS clock generator for use with integrated logic circuits for generating internal CMOS phase clock signals in which the overlap voltage is adjustable.

It is another object of the present invention to provide a CMOS clock generator which includes means for adjusting the clock overlap voltage either up or down to speed up or slow down a semiconductor chip after fabrication.

It is still another object of the present invention to provide a CMOS clock generator for generating internal CMOS phase clock signals in which the overlap voltage is adjustable by a laser to break or open up fuses connected to electrodes of transistor devices.

In accordance with these aims and objectives, the present invention is concerned with the provision of a CMOS clock generator for generating internal CMOS phase clock signals having an adjustable overlap voltage which includes a first circuit having a first input responsive to an input clock signal for generating a first phase clock signal on its output and a second circuit having a first input responsive to the input clock signal for generating a second phase clock signal on its output. The first circuit has a second input responsive to the second phase clock signal at the output of the second circuit for controlling the overlap voltage. The second circuit has a second input responsive to the first phase clock signal at the output of the first circuit for controlling the overlap voltage.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
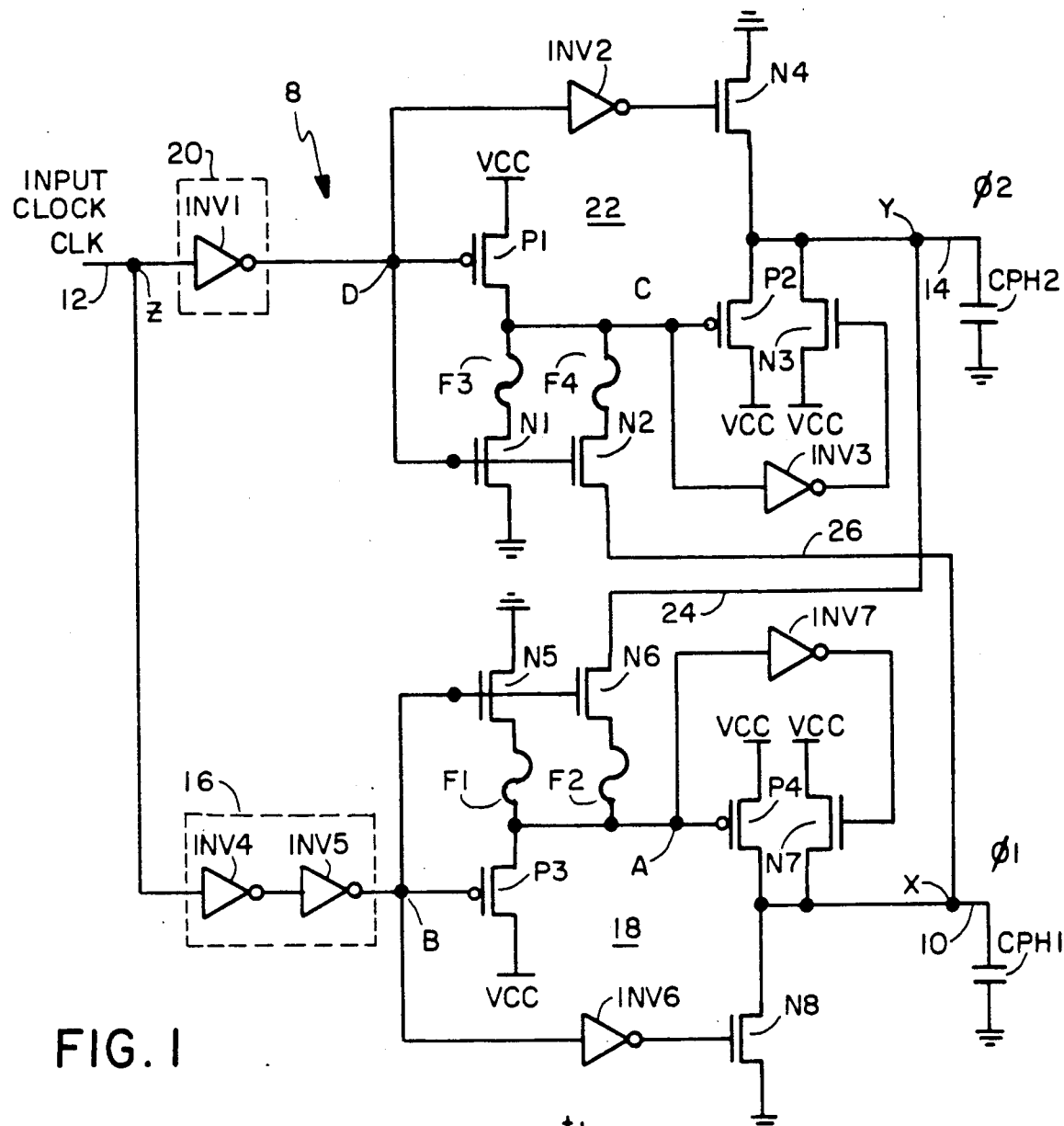
FIG. 1 is a schematic circuit diagram of a CMOS clock generator of the present invention.

Referring now in detail to the drawings, there is shown in FIG. 1 a schematic circuit diagram of a CMOS clock generator 8 of the present invention for generating a first or true internal CMOS level phase clock signal $\phi 1$ at node X on output line 10 and a second or complementary internal CMOS level phase clock signal $\phi 2$ at node Y on output line 14. The CMOS clock generator 8 has an input at node Z connected to an input line 12 for receiving an external input clock signal CLK. The clock generator 8 is formed of a first delay circuit 16, a first phase clock generating circuit 18, a second delay circuit 20 and a second phase clock generating circuit 22.

The first delay circuit 16 is formed of a pair of series-connected inverters INV4 and INV5, and the second delay circuit 20 is formed of a single inverter INV1. The first phase clock generating circuit 18 has a first input connected to the output of the inverter INV5 and a second input coupled to the output line 14 via line 24 and the node Y. The output of the first phase clock generating circuit 18 is defined by the node X. A capacitive load represented by a capacitor CPH1 is connected between the node X and a ground potential.

The second phase clock generating circuit 22 has a first input connected to the output of the inverter INV1 and a second input coupled to the output line 10 via line 26 and the node x. The output of the second phase clock generating circuit 22 is defined by the node Y. A capacitive load represented by a capacitor CPH2 is connected between the node Y and the ground potential.

The first phase clock generating circuit 18 includes a first P-channel transistor P3, a first N-channel transistor N5, and a second N-channel transistor N6. The transistor P3 has its source connected to a supply potential VCC, which is typically at +5.0 volts, and its drain connected to an internal node A. The transistor N5 has its source connected to the ground potential and its drain connected via a fuse F1 to the node A. The transistor N6 has its source connected via the line 24 to the output of the second phase clock generating circuit 22 at the node Y and its drain connected via a fuse F2 to the node A. The gates of the transistors P3, N5 and N6 are all connected together and to an internal node B defining the input of the first phase clock generating circuit 18. The fuses F1 and F2 may, for example, be metal, silicide or a semiconductor such as polysilicon material which may be opened or blown by the use of a laser cut.

The first phase clock generating circuit 18 further includes inverters INV6, INV7: a first pull-up transistor P4: a second pull-up transistor N7; and a pull-down transistor N8. The transistor P4 has its source connected to the supply potential VCC and its drain connected to the source and drain of the respective transistors N7 and N8 and to the node X. The transistor N7 has also its drain connected to the supply potential VCC. The transistor N8 has its source connected to the ground potential. The inverter INV7 has its input connected to the gate of the transistor P4 at the node A and its output connected to the gate of the transistor N7. The inverter INV6 has its input connected to the node B and its output connected to the gate of the transistor N8.

Similarly, the second phase clock generating circuit 22 includes a first P-channel transistor P1, a first N-channel transistor N1, and a second N-channel transistor N2. The transistor P1 has its source connected to the supply potential VCC and its drain connected to an internal node C. The transistor N1 has its source connected to the ground potential and its drain connected via a fuse F3 to the node C. The transistor N2 has its source connected via the line 26 to the output of the first phase clock generating circuit 18 at the node X and its drain connected via a fuse F4 to the node C. The gates of the transistors P1, N1 and N2 are all connected together and to an internal node D defining the input of the second phase clock generating circuit 22. The fuses F3 and F4 may, for example, be metal, silicide or a semiconductor such as polysilicon material which may be opened or blown by the use of a laser out.

The second phase clock generating circuit 22 further includes INV2, INV3; a first pull-up transistor P2: a second pull-up transistor N3: and a pull-down transistor N4. The transistor P2 has its source connected to the supply potential VCC and its drain connected to the source and drain of the respective transistors N3 and N4 and to the node Y. The transistor N3 has also its drain connected to the supply potential VCC. The transistor N4 has its source connected to the ground potential. The inverter INV3 has its input connected to the gate of the transistor P2 at the node C and its output connected to the gate of the transistor N3. The inverter INV2 has its input connected to the node D and its output connected to the gate of the transistor N4.

As can be seen, the output of the first phase clock generating circuit 18 at the node X provides a feedback control voltage which is fed via the line 26 as the second input to the second phase clock generating circuit 22. Similarly, the output of the second phase clock generating circuit 22 at the node Y provides a feedback control signal which is fed via the line 24 as the second input to the first phase clock generating circuit 18. Thus, the feedback control voltages from the outputs of the respective clock generating circuits 18 and 22 are utilized to control the rising edge of the other output or to control thus the overlap voltage.

Figure 2:
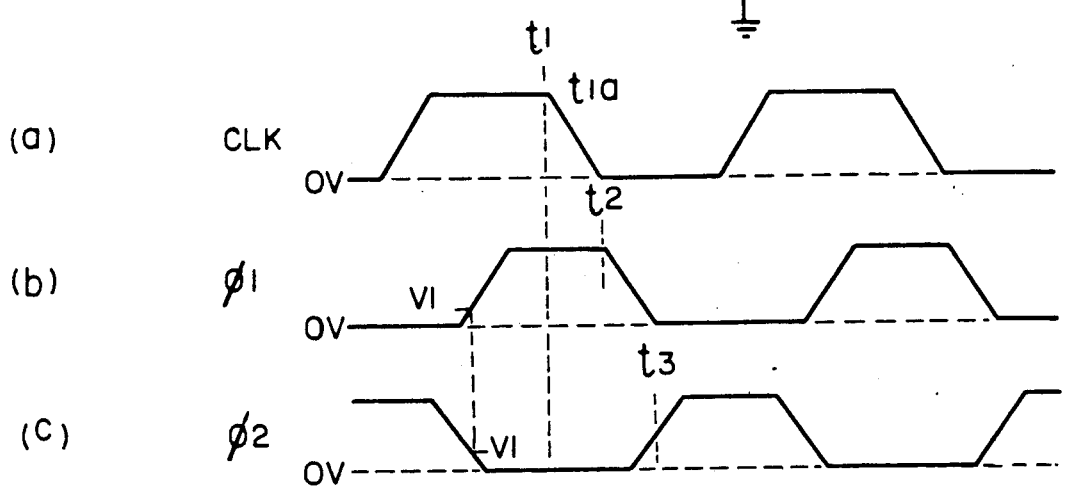
FIGS. 2(a)-2(c) are waveforms useful in understanding the operation of FIG. 1.

For explaining the normal operation of the CMOS clock generator 8 of FIG. 1 with none of the fuses F1–F4 being blown, reference is made to the waveforms shown in FIGS. 2(a) through 2(c). Initially, it is assumed that the external input clock signal CLK on the input line 12 is at a high or "1" logic level. This is illustrated in FIG. 2(a) at time t1. Further, it is assumed that the true phase clock signal $\phi 1$ on the output line 10 is at the high logic level and that the complementary phase clock signal $\phi 2$ is at the low or "$\phi$" logic level during this time t1. The phase clock signals $\phi 1$ and $\phi 2$ are shown in FIGS. 2(b) and 2(c), respectively.

When the input clock signal CLK makes a high-to-low transition at time t1a, the N-channel transistors N5 and N6 will be turned off, the P-channel transistor P3 will be turned on and the output of the inverter INV6 will change to a high or "1" logic level. This will, in turn, cause the pull-up transistors P4 and N7 to be turned off and cause the pull-down transistor N8 to be turned on. As a result, the true phase clock signal $\phi 1$ on the output line 10 will begin making a high-to-low transition at time t2. At the time t1a when the input clock signal CLK makes the high-to-low transition, this causes simultaneously the turning on of the N-channel transistors N1 and N2 and the turning off of the P-channel transistor P1. Since both the source electrode of the transistor N2 and internal node C are sitting at the supply potential VCC prior to the time t1a, there is formed a voltage divider from the output line 10 to the ground potential when the transistors N1 and N2 are turned on.

It will be noted, however, that the voltage on the node C is also used to drive the gate of the pull-up transistor P2 and the gate of the pull-up transistor N3 via the inverter INV3. By designing the size of the transistor N2 to be larger than the size of the transistor N1, the voltage at the node C will discharge only slightly when the transistors N1 and N2 are turned on initially and will not decrease further until the voltage on the output line 10 begins to discharge.

While the voltage on the node C is decreased at the time t1a, it will be insufficient to completely turn on the pull-up transistors P2 and N3. Thus, the complementary phase clock signal $\phi 2$ on the output line 14 will not be affected significantly. The voltage on the node C will not change significantly until the time t2 when the true phase clock signal $\phi 1$ begins going low. This will allow the voltage on the node C to go low. As a result, the pull-up transistors P2 and N3 will be turned on completely so as to charge up the capacitor CPH2. The purpose of the transistor N3 is to limit the overshoot when the node Y is making a low-to-high transition by increasing the output impedance and to reduce current to the node Y at the time t1a when the node C is decreased somewhat. Consequently, the complementary phase clock signal $\phi 2$ on the output line 14 will make a low-to-high transition at the time t3.

Figure 4A:
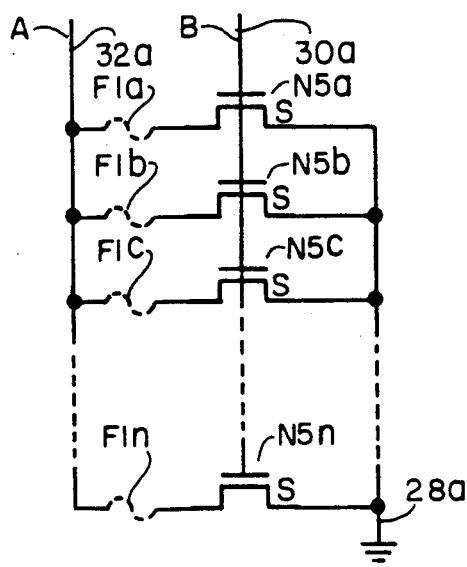
FIGS. 4(a)-4(d) are schematic circuit diagrams showing how each of the transistors N5, N6, N1 and N2 and associated fuses may be implemented as a plurality of transistors N5a-N5n; N6a-N6n; N1a-N1n; and N2a-N2n, respectively with their associated fuses.

The transistor N5 may be constructed alternately as a plurality of individual transistors N5a, N5b, ... N5n connected in parallel as shown in FIG. 4(a). Further, the associated fuse F1 may be replaced with a corresponding plurality of fuses F1a, F1b, ... F1n. As can be seen, all of the source electrodes of the respective plurality of transistors N5a, N5b, ... N5n are connected together and to a lead line 28a which is connectible to the ground potential. All of the gate electrodes of these transistors are connected together and to a lead line 30a which is connectible to the input of the first phase clock generating circuit 18 at the node B. The drain electrodes of the respective transistors N5a, N5b, ... N5n are connected via a corresponding one of the plurality of fuses F1a, F1b, ... F1n, to a lead line 32a which is connectible to the internal node A.

Figure 4B:
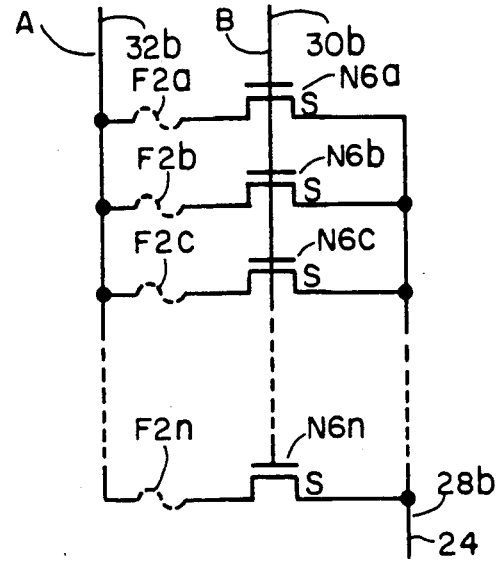

The transistor N6 may be constructed alternately as a plurality of individual transistors N6a, N6b, ... N6n connected in parallel as shown in FIG. 4(b). Further, the associated fuse F2 may be replaced with a corresponding plurality of fuses F2a, F2b, ... F2n. As can be seen, all of the source electrodes of the respective plurality of transistors N6a, N6b, ... N6n are connected together and to a lead line 28b, which is connectible to the output of the second phase clock generating circuit 22 on the line 24. All of the gate electrodes of the transistors are connected together and to a lead line 30b which is connectible to the input of the first phase clock generating circuit 18 at the node B. The drain electrodes of the respective transistors N6a, N6b, ... N6n are connected via a corresponding one of the plurality of fuses F2a, F2b, ... F2n, to a lead line 32b which is connectible to the internal node A.

Figure 4C:
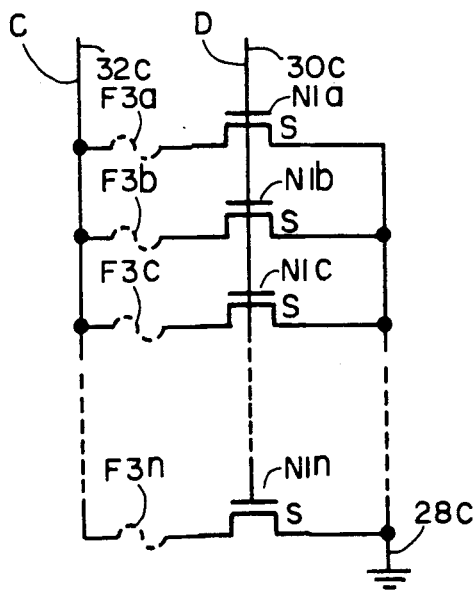

Similarly, the transistor N1 may be constructed alternately as a plurality of individual transistors N1a, N1b, ... N1n connected in parallel as shown in FIG. 4(c). Further, the associated fuse F3 may be replaced with a corresponding plurality of fuses F3a, F3b, ... F3n. As can be seen, all of the source electrodes of the respective plurality of transistors N1a, N1b, ... N1n are connected together and to a lead line 28c which is connectible to the ground potential. All of the gate electrodes of these transistors are connected together and to a lead line 30c which is connectible to the input of the second phase clock generating circuit 22 at the node D. The drain electrodes of the respective transistors N1a, N1b, ... N1n are connected via a corresponding one of the plurality of fuses F3a, F3b, ... F3n to a lead line 32c which is connectible to the internal node C.

Figure 4D:
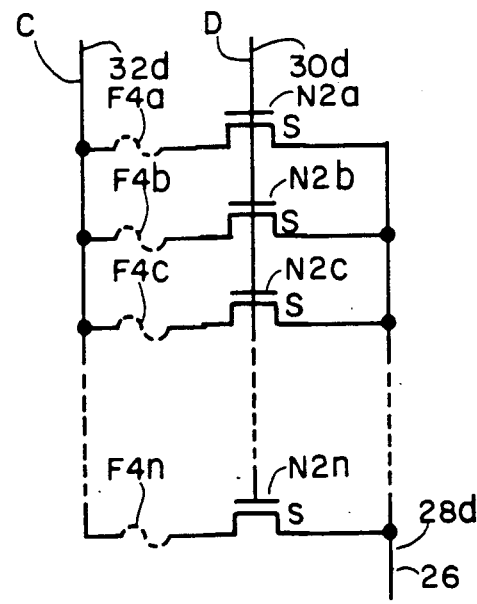

Similarly, the transistor N2 may be constructed alternately as a plurality of individual transistors N2a, N2b, ... N2n connected in parallel as shown in FIG. 4(d). Further, the associated fuse F4 may be replaced with a corresponding plurality of fuses F4a, F4b, ... F4n. As can be seen, all of the source electrodes of the respective plurality of transistors N2a, N2b, ... N2n are connected together and to a lead line 28d, which is connectible to the output of the first phase clock generating circuit 18 on the line 26. All of the gate electrodes of the transistors are connected together and to a lead line 30d which is connectible to the input of the second phase clock generating circuit 22 at the node D. The drain electrodes of the respective transistors N2a, N2b, ... N2n are connected via a corresponding one of the plurality of fuses F4a, F4b, ... F4n to a lead line 32d which is connectible to the internal node C.

With each of the transistors N5, N6, N1 and N2 and each of the associated fuses F1, F2, F3 and F4 being implemented as described above as a plurality of individual transistors and fuses, there is provided a means for adjusting or controlling over a relatively wide range the amount of clock overlap voltage between the internal phase clock signals $\phi1$ and $\phi2$. The overlap voltage is selectively adjusted or controlled by blowing or opening by a laser cut certain ones of the plurality of fuses one at a time in a first predetermined order so as to increase the amount of overlap voltage or in a second predetermined order so as to decrease the amount of overlap voltage.

As each selected one of the plurality of fuses F1a-F1n, F2a-F2n, F3a-F3n, and F4a-F4n are blown or opened in a predetermined order by the laser cut, the width of the channel will be shortened which will increase the resistance ($R=L/W$) of the corresponding plurality of transistors. In this manner, the ratio of the resistance between the plurality of transistors N5a-N5n and N6a-N6n (or the plurality of transistors N1a-N1n and N2a-N2n) can be selectively controlled.

Figure 3A:
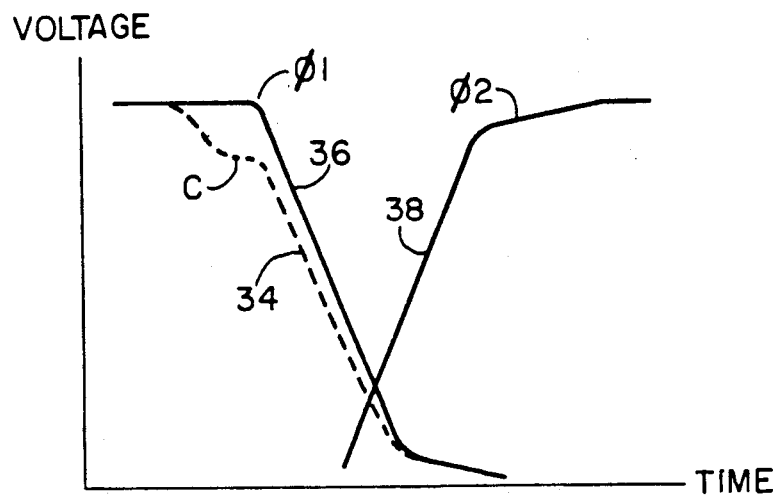
FIGS. 3(a)-3(c) are plots of the voltages at the node C of FIG. 1 relative to the voltages of the true phase clock signal dependent upon the ratio of the sizes of the transistors N1a-N1n and N2a-N2n.
Figure 3B:
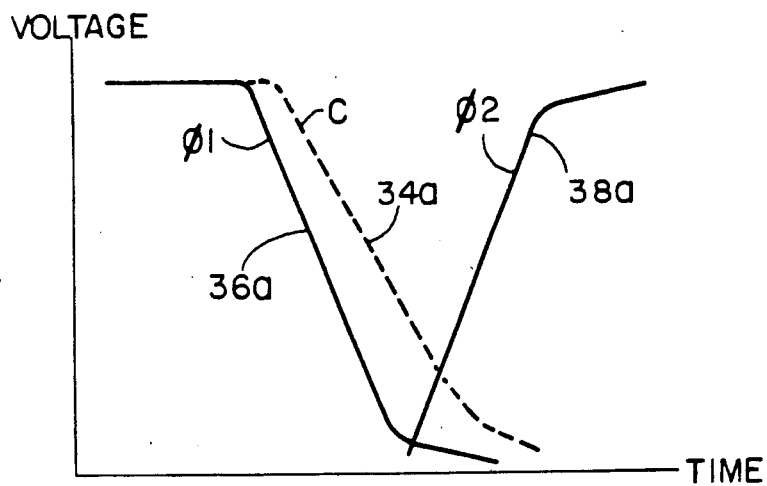
Figure 3C:
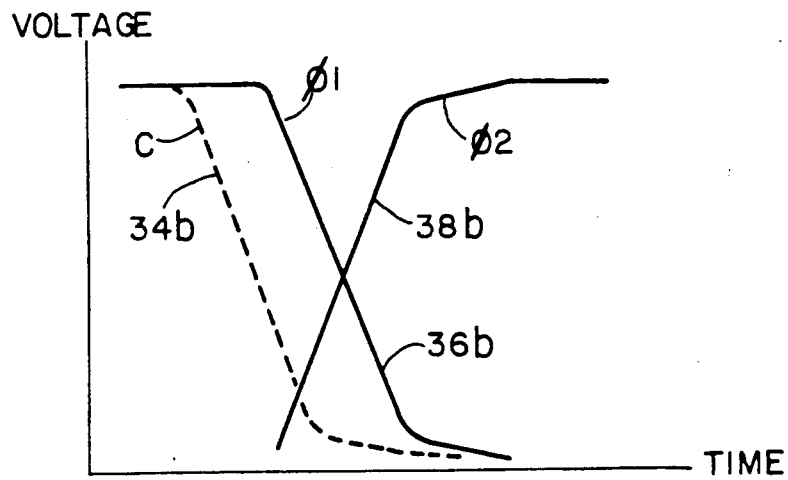

Referring now to FIGS. 3(a)-3(c), there are illustrated plots of the voltages at the node C of FIG. 1 relative to the true and complementary phase clock signals $\phi1$ and $\phi2$. In particular, there is depicted in FIG. 3(a) the voltage at the node C (dotted curve 34) relative to the true clock signal $\phi1$ (curve 36) and the complementary clock signal $\phi2$ (curve 38) prior to any adjustments being made. In other words, none of the plurality of fuses F1a-F1n, F2a-F2n, F3a-F3n, and F4a-F4n have been blow or opened. As can be seen, the voltage at the node C (curve 34) is slightly leading the voltage of the true phase clock signal $\phi1$ on the output line 10. The amount of nominal overlap voltage between the trailing edge of the true phase clock signal $\phi1$ and the leading edge of the complementary phase clock signal $\phi2$ is approximately VCC/4.

If its is desired to decrease the amount of overlap voltage therebetween, the plurality of fuses F3a-F3n would be blown initially by a laser cut one fuse at a time. Then, the plurality of fuses F4a-F4n would be blown by a laser cut again one at a time until only one fuse (i.e., F4n) is remaining. As each one of the plurality of fuses is blown, the voltage at the node C will gradually lead the voltage of the true phase clock signal $\phi1$ less and less and will eventually lag the voltage of the clock signal $\phi1$ more and more. When all of the plurality of transistors N1a-N1n and N2a-N2n except for transistor N2n have been eliminated, i.e., by blowing all of the fuses F3a-F3n and F4a-F4n except for fuse F4n, the voltage on the node C (dotted curve 34a) will appear as illustrated in FIG. 3(b) as lagging the voltage of the true phase clock signal $\phi1$.

As a result, this produces the minimal amount of overlap voltage between the trailing or falling edge of the true phase clock signal $\phi1$ (curve 36a) and the leading or rising edge of the complementary phase clock signal $\phi2$ (curve 38a). It will be apparent to those skilled in the art that the plurality of fuses F1a-F1n and F2a-F2n except for the fuse F2n can be blown in a similar manner so as to decrease the amount of overlap voltage between the trailing or falling edge of the complementary phase clock signal $\phi2$ and the leading or rising edge of the true phase clock signal $\phi1$.

On the other hand, if it is desired to increase the amount of overlap voltage between the trailing edge of the clock signal $\phi1$ and the leading edge of the clock signal $\phi2$, the plurality of fuses F4a-F4n would be blown by a laser cut one fuse at a time. As each one additional fuse is blown, the voltage at the node C will lead the voltage of the true phase clock signal $\phi 1$ more and more. When all of the plurality of transistors N2a–N2n have been eliminated, i.e., by blowing all of the fuses F4a–F4n, the voltage on the node C (dotted curve 34b) will appear as illustrated in FIG. 3(c) as leading the voltage of the true phase clock signal $\phi 1$.

As a result, this produces the maximum overlap voltage between the trailing or falling edge of the clock signal $\phi 1$ (curve 36b) and the clock signal $\phi 2$ (curve 38b), which is approximately VCC/2 since there will be no delay or feedback. Similarly, it should be readily apparent to those skilled in the art that the plurality of fuses F2a–F2n can be blown by a laser cut one fuse at a time in order to increase the amount of overlap voltage between the trailing or falling edge of the complementary phase clock signal $\phi 2$ and the leading or rising edge of the true phase clock signal $\phi 1$.

From the foregoing detailed description, it can thus be seen that the present invention provides an improved CMOS clock generator for use with integrated circuits for generating internal CMOS phase clock signals having an adjustable overlap voltage. The overlap voltage between the internal phase clock signals is adjusted either up or down to speed up or slow down a semiconductor chip after fabrication. This is achieved by the utilization of a laser to break or open up fuses connected to electrodes of transistor devices.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A CMOS clock generator used on a single semiconductor integrated chip for generating internal CMOS phase clock signals having an adjustable overlap voltage, said clock generator comprising:

first delay means (16) having an input coupled to receive an input clock signal (CLK) and an output;

said first delay means (16) including a first inverter (INV4) having its input connected to receive the input clock signal (CLK) and an output, and a second inverter (INV5) having its input connected to the output of said first inverter (INV4) and an output defining the output of said first delay means;

first phase clock generating circuit means (18) having first and second inputs and an output for generating a first phase clock signal ($\phi 1$);

second delay means (20) having an input coupled to receive said input clock signal (CLK) and an output;

said second delay means (20) including a third inverter (INV1) having its input connected to receive the input clock signal (CLK) and an output defining the output of said second delay means;

second phase clock generating circuit means (22) having first and second inputs and an output for generating a second phase clock signal ($\phi 2$);

said first phase clock generating circuit means (18) having its first input coupled to the output of said first delay means (16) and its second input coupled to receive said second phase clock signal ($\phi 2$) for controlling the overlap voltage;

said first phase clock generating circuit means (18) including a P-channel transistor (P3), a plurality of first N-channel transistors (N5a–N5n) and a plurality of second N-channel transistors (N6a–N6n), said first P-channel transistor (P3) having its source connected to a supply potential (VCC) and its drain connected to a first node (A), each of said first plurality of N-channel transistors (N5a–N5n) having its source connected to a ground potential and its drain connected via respective first fuses (F1a–F1n) to the first node (A), each of said second plurality of N-channel transistors (N6a–N6n) having its source connected to the output of said second phase clock generating circuit means (22) and its drain connected via respective second fuses (F2a–F2n) to the first node (A), the gates of the transistors (P3, N5a–N5n and N6a–N6n) being connected together at a second node (B) defining the first input of said first phase clock generating means;

said first phase clock generating circuit means (18) further including a first pull-up transistor (P4), a second pull-up transistor (N7), a pull-down transistor (N8), a first inverter (INV6), and a second inverter (INV7), said first pull-up transistor (P4) having its source connected to the supply potential (VCC) and its drain connected to the source of the said second pull-up transistor (N7) and the drain of said pull-down transistor (N8), said second pull-up transistor (N7) having its drain connected to the supply potential (VCC), said pull-down transistor (N8) having its source connected to the ground potential, said first inverter (INV6) having its input connected to the second node (B) and its output connected to the gate of said pull-down transistor (N8), said second inverter (INV7) having its input connected to the gate of said first pull-up transistor (P4) at the first node (A) and its output connected to the gate of said second pull-up transistor (N7);

said second phase clock generating circuit means (22) having its first input coupled to receive the output of said second delay means (20) and its second input coupled to receive said first phase clock signal ($\phi 1$) for controlling the overlap voltage;

the overlap voltage between a trailing edge of the second phase clock signal and a leading edge of the first phase clock signal being gradually decreased when each of said first fuses (F1a–F1n) is blown one at a time by a laser cut; and the overlap voltage between the trailing edge of the second phase clock signal and the leading edge of the first phase clock signal being gradually increased when each of said second fuses (F2a–F2n) is blown one at a time by the laser cut.

2. A CMOS clock generator as claimed in claim 1, wherein said second phase clock generating circuit means (22) includes a P-channel transistor (P1), a plurality of first N-channel transistors (N1a–N1n) and a plurality of second N-channel transistors (N2a–N2n), said P-channel transistor (P1) having its source connected to a supply potential (VCC) and its drain connected to a third node (C), each of said first N-channel transistors (N1a–N1n) having its source connected to a ground potential and its drain connected via respective third fuses (F3a–F3n) to the third node (C), each of said plurality of second N-channel transistors (N2a–N2n) having its source connected to the output of said first phase clock generating circuit means (18) and its drain connected via respective fourth fuses (F4a–F4n) to the third node (C), the gates of the transistors (P1, N1a–N1n and N2a–N2n) being connected together at a fourth node (D) defining the first input of said second phase clock generating means.

3. A CMOS clock generator as claimed in claim 2, wherein each of said third fuses (F3a–F3n) is blown one at a time by a laser cut, the overlap voltage between a trailing edge of the first phase clock signal and a leading edge of the second phase clock signal is gradually decreased.

4. A CMOS clock generator as claimed in claim 3, wherein each of said fourth fuses (F4a–F4n) is blown one at a time by a laser cut, the overlap voltage between the trailing edge of the first phase clock signal and the leading edge of the second phase clock signal is gradually increased.

* * * * *